Figure 1A:
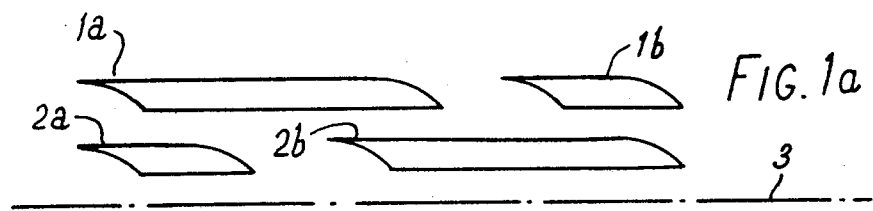

United States Patent [19]

Young et al.

[11] 4,449,097

[45] May 15, 1984

[54] NUCLEAR MAGNETIC RESONANCE SYSTEMS

[75] Inventors: Ian R. Young, Sunbury-on-Thames; Michael Burl, Hampton Hill, both of England

[73] Assignee: Picker International Limited, Wembley, England

[21] Appl. No.: 283,635

[22] Filed: Jul. 15, 1981

[30] Foreign Application Priority Data

Aug. 6, 1980 [GB] United Kingdom ............... 8025615

[51] Int. Cl.$^3$ ............................................. G01R 33/08
[52] U.S. Cl. ..................................... 324/309; 324/318
[58] Field of Search ......... 324/300, 307, 309, 318–320

[56] References Cited

U.S. PATENT DOCUMENTS

| 4,015,196 | 3/1977 | Moore | 324/309 |
| 4,339,716 | 7/1982 | Young | 324/309 |

FOREIGN PATENT DOCUMENTS 1508438 4/1974 United Kingdom .
1584948 5/1978 United Kingdom .

OTHER PUBLICATIONS

"Image Formation by Nuclear Magnetic Resonance: The Sensitive-Point Method"; Journal of Applied Physics, vol. 47, No. 8, Aug. 1976, pp. 3709–3721.
"Display of Cross-Sectional Anatomy by Nuclear Magnetic Resonance Imaging", Hinshaw et al.; British Journal of Radiology, 51, 273–280, 1978.

*Primary Examiner*—Michael J. Tokar
*Attorney, Agent, or Firm*—Fleit, Jacobson, Cohn & Price

[57] ABSTRACT

Nuclear magnetic resonance methods have been proposed for examination of large bodies, including medical examination of patients. These include so-called steady state free precession methods. Such methods involve alternating excitation of a region of the body in such a way that an equilibrium condition is established at which a mean resonance signal is detectable. Typically for excitation of a planar region a radio frequency excitation field is provided in the presence of a field having an alternating gradient so that equilibrium is only reached in the plane. It is now proposed to achieve the same result by the application of two radio frequency fields having opposing gradients and pulsed in alternation to balance substantially only in the plane and provide equilibrium only there. The fields are provided by respective sets of saddle shaped coils divided into pairs of unequal dimension (1a, 1b, 2a, 2b) to provide the respective gradients.

9 Claims, 4 Drawing Figures

NUCLEAR MAGNETIC RESONANCE SYSTEMS

The present invention relates to systems for examining a body by means of nuclear magnetic resonance (NMR), in particular by providing images of distributions of a quantity, in a chosen region of the body. Such techniques may be used for examining bodies of different kinds but a particular, beneficial application is the examination of patients for medical purposes.

Nuclear magnetic resonance is well known for the analysis of materials, particularly by spectroscopy. Recently it has been suggested that the techniques should be applied to medical examinations to provide images of distributions of water content or relaxation time constants in sectional slices or volume of patients. Such distributions are similar to, although of different significance from, the distributions of X-ray attenuation provided by computerised tomography (CT) systems.

Practical NMR systems operate by applying suitable combinations of magnetic fields to the body being examined, via coil systems, and detecting induced currents in one or more detector coil systems. A number of different examination methods have been used in spectroscopy, and proposals have been made for using the different methods for medical imaging. One known method is that known as "steady state free precession" (SFP) and proposals using this method for imaging have been made by W. S. Hinshaw, J. Appl. Phys. 47 (8), 8/76, 3709–3721 and Brit. J. Rad 51, 273–280 and by W. S. Moore and W. S. Hinshaw is British Pat. No. 1508438 and U.S. Pat. No. 4,015,196, which is hereby incorporated herein by reference.

This technique includes three variations each of which includes the application of magnetic fields including a steady magnetic field $H_{zo}$ in an axial direction z. In the first a "sensitive point" is selected by three orthogonal alternating field gradients in the presence of a radio frequency field, the point lying where all of the gradients have a zero value. A continuous resonance signal is sensed during application of the field and relates only to the sensitive point. The second variation of the technique uses only two orthogonal alternating field gradients to select a "sensitive line". A steady field gradient is then applied to disperse the resonance frequencies along the line and the received signal is Fourier transformed to give values for elements along the line. This is repeated for different lines by varying the field gradient intensities. In the third variation a single alternating field gradient only is used and this selects a "sensitive plane." A steady field gradient is again applied and the resonance frequencies dispersed across the plane. Fourier Transformation then gives resonance values for a plurality of parallel strips in the plane. The steady gradient is applied in many different directions in the plane to give output values for many sets of parallel strips in different directions. These are processed by methods known in CT to give values for small elements in the plane and thereby to form an image. The procedures are fully explained in said references and the use of CT type of processing in NMR is explained in U.S. Pat. No. 4,254,778.

This invention relates to the third of said variations and it is an object of the invention to provide an improvement thereto.

According to the invention there is provided a nuclear magnetic resonance system for examining a region of a body by a steady state free precession procedure, the system including, for selecting and exciting a chosen slice of the body, a coil system providing two RF fields pulsed in alternation and having respective gradients in opposing directions perpendicular to the plane of the slice.

Figure 1B:
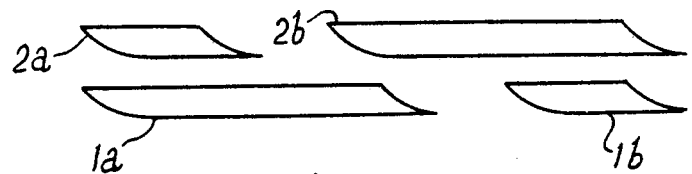
Figure 1B:
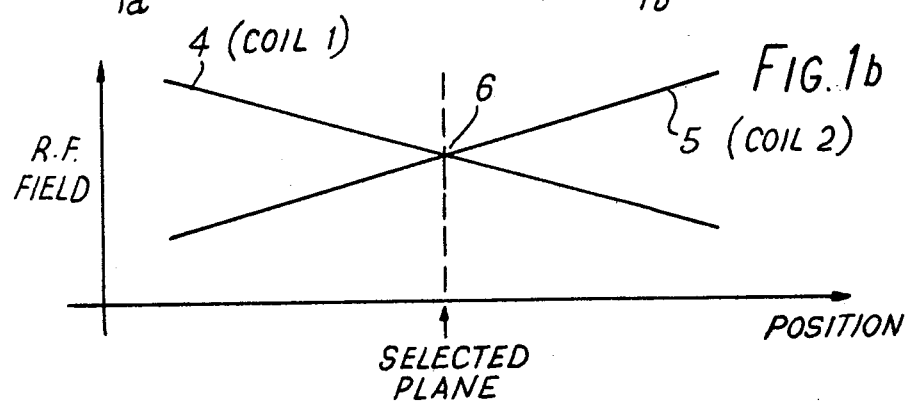
Figure 2:
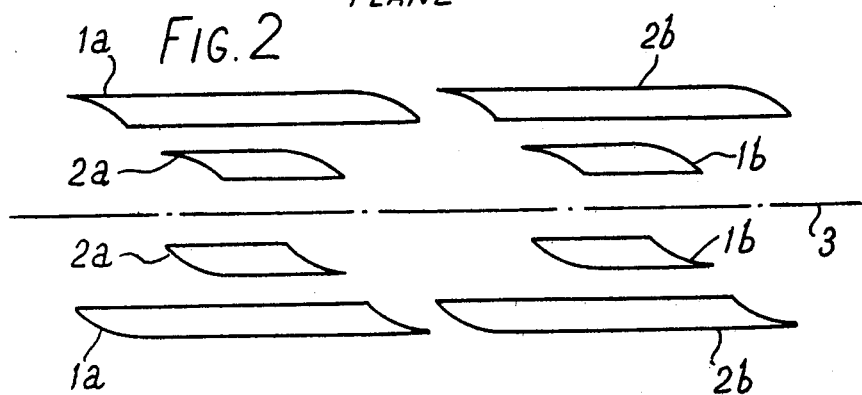
Figure 3:
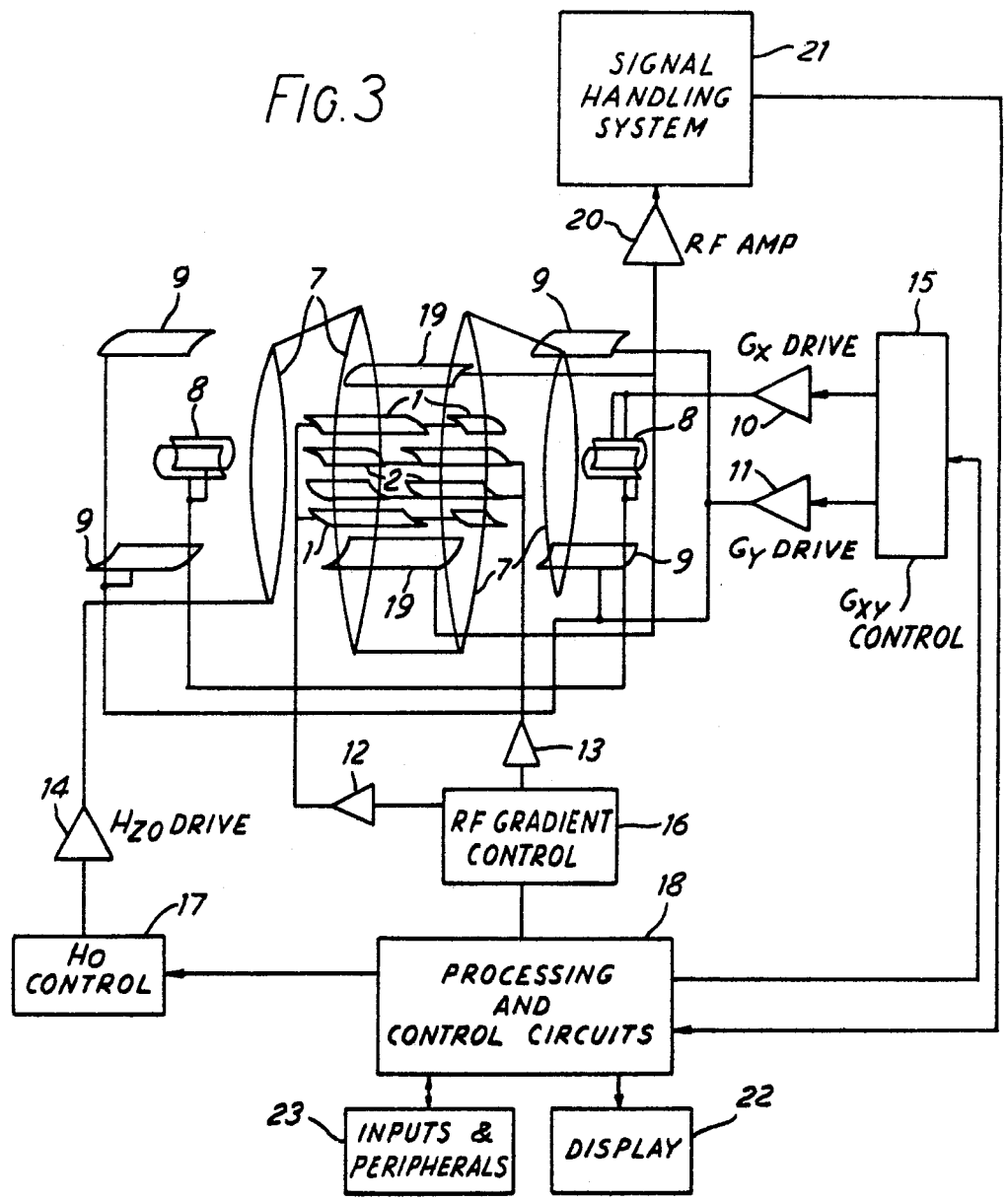

In order that the invention may be clearly understood and readily carried into effect an embodiment thereof will now be described by way of example with reference to the accompanying drawings of which, FIG. 1a shows an RF coil system for implementing the invention, FIG. 1b shows the gradient fields produced by the coil of FIG. 1a, FIG. 2 shows an alternative arrangement for the RF coils of the invention, and FIG. 3 shows in schematic form a known NMR apparatus adapted in accordance with this invention to include an RF coil system as shown in FIG. 1.

In SFP methods such as those of Hinshaw, referred to hereinbefore, slice selection is achieved by the conventional method of applying, together with a steady field $H_{zo}$ in the direction (z) perpendicular to the slices, a field having a gradient in the same direction. The field is, for SFP, an alternating one in conjunction with rapid bursts of an RF field to induce resonance in the sensitive plane. Since the RF is applied in the presence of gradients the bursts may be short and their peak power high. This makes control of the plane selected doubtful.

It is proposed to effect the selection of the plane by replacing the alternating gradient combined with RF bursts by alternating pulses of two RF fields graded in amplitude. The fields are produced by two coaxial sets of saddle shaped coils shown at 1 and 2 in FIG. 1a. The patient, not shown, is disposed along the axis 3 thereof. Coil 1 comprise two pairs 1a and 1b producing a field greater at one end (1a) and coils 2 comprise two pairs producing a field greater at the other end (2b) of the patient position. They are driven by conventional drive circuits.

These coils produce RF fields shown in FIG. 1b at 4 (for coils 1) and 5 (for coils 2). The fields produced by the two coil sets are equal at the centre (6). In the SFP process alternate pulses (usually of the field gradient but in this case the RF field) switch the sample one way and then the other. In the central region the pulses balance alternately and the signal rapidly reaches an equilibrium value which is a function of both the time constant $T_1$, known as the spin-lattice relaxation time, and the time constant $T_2$, known as the spin-spin relaxation time. Outside of the selected plane the patient's body is subject to RF pulses which are significantly asymmetric. Under these circumstances the signal received from the material no longer integrates, and if the time constant $T_1$, is sufficiently long the signal averages out. Signal is then received only from the plane which is thereby selected. The effective slice thickness is dependent on the gradient of the RF fields and on the $T_1$ constant, which provides some recovery from the net rotation produced by the unbalanced RF pulses. This recovery is in turn dependent on the pulse repetition frequency of the RF pulses.

It will be appreciated that the RF coil layout need not be as shown in FIG. 1a provided it achieves the gradients shown in FIG. 1b. For example they may conveniently be as shown in FIG. 2.

FIG. 3 shows in schematic form a nuclear magnetic resonance apparatus employing RF gradient coils as described in relation to FIG. 1. This apparatus is, apart from the use of such RF gradient coils, essentially as described in U.S. Pat. No. 4,315,216 and in the corresponding U.S. patent application Ser. No. 06/039650 filed May 16, 1979. The coils shown therein are illustrated schematically, their form being familiar to those experienced with nuclear magnetic resonance imaging, and comprise coils 7 which provide a steady field (Hzo) aligned with axis 3 and coils 8 and 9 which provide fields Gx and Gy respectively. The fields $$GX \frac{(= \partial H_z)}{\partial x} \text{ and } Gy \frac{(= \partial H_z)}{\partial y}$$

are fields in the direction (z) of the axis 3 but having gradients in respective directions x and y orthogonal in the selected plane (FIG. 1b). These combine with variable amplitudes to give a field $G_R$ having a gradient in a direction R in the plane $$G_R \frac{(= \partial H_z)}{\partial r}$$

which provides the dispersion of resonance frequencies referred to hereinbefore. The direction of R is varied by suitable manipulation of the relative amplitudes of Gx and Gy. The RF gradient coils 1 and 2 described hereinbefore are also shown in FIG. 3.

These coils are driven by respective drive amplifiers 10 (Gx), 11 (Gy), 12 (RF gradient 4), 13 (RF gradient 5) and 14 ($H_{zo}$), controlled by xy ($G_R$), RF gradient and $H_{zo}$ control circuits 15, 16 and 17 respectively. These circuits can take suitable form well known to those with experience of nuclear magnetic resonance equipment and other apparatus using coil-induced magnetic fields. Typically they may include read only memories storing predetermined values of the fields required for different sequences and stages of the examination and providing these value signals to the drive amplifiers in response to initiating signals from a central processing and control unit 18 to achieve the desired sequence of application of fields. These read only memories in circuits 18 therefore retain a sequence switching the RF currents to coils 1 and 2 in alternating pulses to satisfy the conditions described hereinbefore.

The resonance signal sensed during the application of the $G_R$ field is detected in coils 19 and amplified by an RF amplifier 20 before being applied to signal handling circuits 21. The circuits 21 are arranged to make any appropriate calibrations and corrections but essentially transmit the signals, which are effectively values for different strips, in the plane, perpendicular to the direction R, to the processing circuits to provide the required representation of the examined slice of the patient lying in the plane selected. These circuits can be specially designed to implement the CT types of processing as described and claimed in British Pat. No. 1,584,948 and U.S. application Ser. No. 06/048777, now U.S. Pat. No. 4,284,950. It is, however, advantageous to implement the processing by a suitably programmed digital computer. This computer can also conveniently control the sequence of fields applied and thus represents the circuits, indicated at 18.

The picture thus obtained is viewed on a suitable display 22, such as a television monitor, and this may include input and other peripherals 23 for the provision of commands and instructions to the equipment, or other forms of output.

The apparatus which is illustrated in FIG. 4 also includes among other things, field measurement and error control circuits and field probes with which these circuits cooperate to sense the actual fields present and their deviations from intended values. These circuits and probes are not shown in FIG. 4, to reduce the complexity thereof. They are now well described elsewhere, for example U.S. Pat. Nos. 4,307,344 and 4,284,950 and are not essential to the present invention.

Other features known in NMR imaging and described in the said references may be included as required and, of course, other variations of the invention will readily suggest themselves to those skilled in the art of NMR imaging.

What we claim is:

1. A nuclear magnetic resonance system for examining a region of a body by a steady state free precession procedure, the system including, for selecting and exciting a chosen slice of the body, a coil system providing two RF fields having respective gradients in opposing directions perpendicular to the plane of the slice.

2. A system according to claim 1 in which the coil system comprises a first set of coils having non-uniform structure in a first direction to produce one of said RF fields in response to RF current therein and a second set of coils having non-uniform structure in a second direction opposite to said first direction to produce the second of said RF fields in response to RF current therein.

3. A system according to claim 2 in which each of said set is a set of saddle shaped coils.

4. A system according to claim 3 in which each set of saddle shaped coil comprises one larger pair and one smaller pair of coils, the respective similar parts of the two sets being disposed substantially on opposite sides of said chosen slice.

5. A system according to claim 4 in which the coils of one set are disposed at substantially a first radius about the system axis and the coils of the other set are disposed substantially at a second radius.

6. A system according to claim 4 in which the smaller coils of both sets are disposed substantially at a first radius about a system axis and the larger coils of both sets are disposed substantially at a second radius.

7. A method of examining the body of a patient by means of a steady state free precession nuclear magnetic resonance process, the method including applying to the body two RF fields having respective gradients in opposing directions perpendicular to a chosen plane in the body whereby the fields substantially balance in said chosen plane, to produce a steady state free precession signal from said plane which when integrated reaches an equilibrium value, and are unbalanced out of said plane, to produce from outside said plane a steady state free precession signal which when integrated provides a negligible signal, and analysing the signal from the plane to provide a representation of a slice of the body intersected by the plane.

8. A nuclear magnetic resonance system for examining a region of a body, the system including a coil system and means driving the coil systems to produce two RF fields having respective gradients in opposing directions in the body and means for pulsing the two RF fields in alternation, the respective fields and field gradients having magnitudes such that, in a substantially planar region perpendicular to the opposing directions, the fields balance to integrate and thereby produce, on equilibrium, a steady state free precession signal and outside said planar region are unbalanced and do not integrate so that no such signal is produced.

9. A medical nuclear magnetic resonance system for examining a substantially planar region of the body of a patient, the system including means for applying magnetic fields including two magnetic fields having respective gradients in opposing directions in the body substantially orthogonal to said region, means for pulsing said magnetic fields in alternation, means for controlling the magnitudes of the magnetic fields such that the fields balance substantially in the region to produce, in equilibrium, a steady state free precession signal therefrom and are unbalanced out of the region so that no significant portion of said signal is produced therefrom, means for applying a further magnetic field having a gradient in the region to disperse the phase of the steady state free precession signal, means for repeating the procedure for different directions of the gradient of said further magnetic field and means for analyzing the steady state free precession signals for each of said different directions to provide a representation of said region as a function of said resonance.

* * * * *